US008692260B2

(12) United States Patent
Arena et al.

(10) Patent No.: US 8,692,260 B2
(45) Date of Patent: Apr. 8, 2014

(54) METHOD OF FORMING A COMPOSITE LASER SUBSTRATE (75) Inventors: Chantal Arena, Mesa, AZ (US); Christiaan J. Werkhoven, Gilbert, AZ (US)

(73) Assignee: Soitec, Bernin (FR)

(*) Notice: Subject to any disclaimer, the term of this patent is extended or adjusted under 35 U.S.C. 154(b) by 314 days.

(21) Appl. No.: 13/001,734

(22) PCT Filed: Sep. 21, 2009

(86) PCT No.: PCT/US2009/057652
§ 371 (c)(1),
(2), (4) Date: Dec. 28, 2010

(87) PCT Pub. No.: WO2010/036602
PCT Pub. Date: Apr. 1, 2010

(65) Prior Publication Data
US 2011/0101373 A1     May 5, 2011

Related U.S. Application Data (60) Provisional application No. 61/194,420, filed on Sep. 26, 2008.

(51) Int. Cl.
*H01L 29/20*     (2006.01)
*H01L 33/30*     (2010.01)
(52) U.S. Cl.
USPC .............................. 257/76; 257/43; 257/431
(58) Field of Classification Search
USPC ........ 257/88–103, E33.067, E33.074, 43, 76, 257/431–448
See application file for complete search history.

(56) References Cited

U.S. PATENT DOCUMENTS

| 6,794,276 | B2 | 9/2004 | Letertre et al. |
| 7,235,462 | B2 | 6/2007 | Letertre et al. |
| 8,198,645 | B2* | 6/2012 | Sakai ............................ 257/98 |
| 8,242,484 | B2* | 8/2012 | Khan ............................ 257/15 |

(Continued)

FOREIGN PATENT DOCUMENTS

| DE | 102006061167 A1 | 12/2007 |
| WO | WO-2006138626 | 12/2006 |
| WO | WO-2010036602 A1 | 4/2010 |

OTHER PUBLICATIONS

"International Application Serial No. PCT/US2009/057652, Search Report mailed Jan. 29, 2010", 8 pgs.

(Continued)

*Primary Examiner* — Cuong Q Nguyen
(74) *Attorney, Agent, or Firm* — TraskBritt (57) ABSTRACT

A composite substrate for laser devices is disclosed having improved wave guiding properties, improved lattice matching, improved thermal expansion matching, and improved thermal conductivity. The composite substrate has an intermediate layer formed on a support substrate, and a seed layer formed on the intermediate layer. An active device layer is grown or attached to the seed layer, or to a light confinement layer on the seed layer. The intermediate layer may be formed directly on the support layer, or may be formed by thinning an attached wafer of the intermediate material, which is then thinned to a desired thickness.

13 Claims, 5 Drawing Sheets

(56) References Cited

U.S. PATENT DOCUMENTS

| | | |
|---|---|---|
| 2004/0029359 A1 | 2/2004 | Letertre et al. |
| 2004/0235268 A1 | 11/2004 | Letertre et al. |
| 2004/0248380 A1 | 12/2004 | Aulnette et al. |
| 2006/0255341 A1 | 11/2006 | Pinnington et al. |
| 2007/0243703 A1 | 10/2007 | Pinnington et al. |
| 2008/0049801 A1 | 2/2008 | Eichler et al. |
| 2009/0075481 A1 | 3/2009 | Chen et al. |

OTHER PUBLICATIONS

"International Application Serial No. PCT/US2009/057652, Written Opinion mailed Jan. 29, 2010", 7 pgs.

Jagannadham K, "Compound semiconductor bonded to AlN heat spreader substrate using graded intermediate layer", Journal of Vacuum Science and Technology: Part A, AVS /AIP , Melville , NY., US , vol. 25, No. 3, XP012102617 ISSN: 0734-2101 (Apr. 16, 2007), pp. 536-542.

* cited by examiner

METHOD OF FORMING A COMPOSITE LASER SUBSTRATE

CLAIM OF PRIORITY

This patent application is a U.S. National Stage Filing under 35 U.S.C. 371 from International Patent Application Serial No. PCT/US2009/057652, filed Sep. 21, 2009, and published on Apr. 1, 2010 as WO 2010/036602 A1, which claims the benefit of priority, under 35 U.S.C. Section 119(e), to Chantal Arena, U.S. Provisional Patent Application Ser. No. 61/194,420, entitled "METHOD OF FORMING A COMPOSITE LAYER SUBSTRATE," filed on Sep. 26, 2008, which applications are incorporated by reference herein in their entirety.

TECHNICAL FIELD

This disclosure relates generally to semiconductor devices and device fabrication, and more specifically to composite substrates for light emitting devices such as diode lasers, and methods of forming composite substrates.

BACKGROUND

Known methods of forming light emitting devices, such as light emitting diodes (LEDs) and semiconductor lasers diodes, may include the use of periodic table of elements column III materials such as aluminum (Al), gallium (Ga) and indium (In). Nitrogen (N) is a column V material, and nitride compounds of column III materials may be semiconductive, may be known as III-nitrides, and may be used in light emitting device formation.

Such III-nitride materials may be formed on solid support substrates, such as sapphire ($Al_2O_3$) or silicon carbide (SiC), which may be known as semiconductor on insulator substrates. Sapphire may be the most widely used support material, but may have an issue with crystal lattice parameter mismatch with the III-nitride materials, which may in turn cause physical and electrical problems, such as crystal defects, strain and layer separation. Sapphire may also have a thermal mismatch issue with the III-nitride material, which may be known as a coefficient of thermal expansion (CTE) issue. Sapphire also has a relatively low thermal conductivity, which may lead to thermal reliability issues in operational devices and higher long term failure rates. Silicon carbide support substrates may have better thermal conductivity compared to sapphire, and thus may use simpler device packaging methods, but SiC nonetheless has CTE and lattice mismatch issues with the III-nitride materials. The use of a support material such as a free standing (FS) GaN wafer or a GaN template (e.g., GaN on sapphire), which as III-nitride materials may have a better lattice match with the single crystal III-nitride materials of the light emitting device and may result in superior device yields and function. However, GaN is relatively expensive whether used as a free standing (FS) wafer or formed on a substrate (i.e., a template).

Present III-nitride laser devices may use a light confinement layer located between the support substrate and the active laser device layer to improve the efficiency of light coupling in the laser diode to the light emission active location. The light confinement layer may be a relatively thick layer (for example 500 nm) of aluminum gallium nitride (AlGaN) since the difference in refractive index ($\Delta n$) between the AlGaN and the active device material used in the multi-quantum well may maximize the confinement factor (F). An example of an active device layer may include layers of indium gallium nitride interleaved with layers of gallium nitride (i.e., InGaN/GaN), to form a multiple quantum well structure. However, the lattice match between an AlGaN light confinement layer and either the GaN or the InGaN layers of the active device may not be sufficient for acceptable operation and yield.

The above noted issues of expensive support substrates, thermal and lattice mismatch between support substrates and the III-nitride materials of the light confinement layer and active light emitting layers, may decrease the fabrication yield, increase the cost, and prevent widespread acceptance of III-nitride based optical emission devices such as laser diodes.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms "wafer" and "substrate" as used in the following description may include any structure having an exposed surface with which to form optical emission devices, photovoltaic devices, diodes, transistors, integrated circuit (IC) structures, or passive devices such as resistors and capacitors. The term "substrate" is understood to include semiconductor wafers. The term "substrate" is also used to refer to semiconductor structures during processing, and may include other layers that have been fabricated thereupon. Both "wafer" and "substrate" include doped and undoped semiconductors, epitaxial semiconductor layers supported by a base semiconductor or insulator, polycrystalline and amorphous materials, as well as other semiconductor structures well known to one skilled in the art. The term "conductor" is understood to generally refer to materials that allow electrical signals to propagate, and include n-type and p-type semiconductors. The term "insulator" or "dielectric" is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
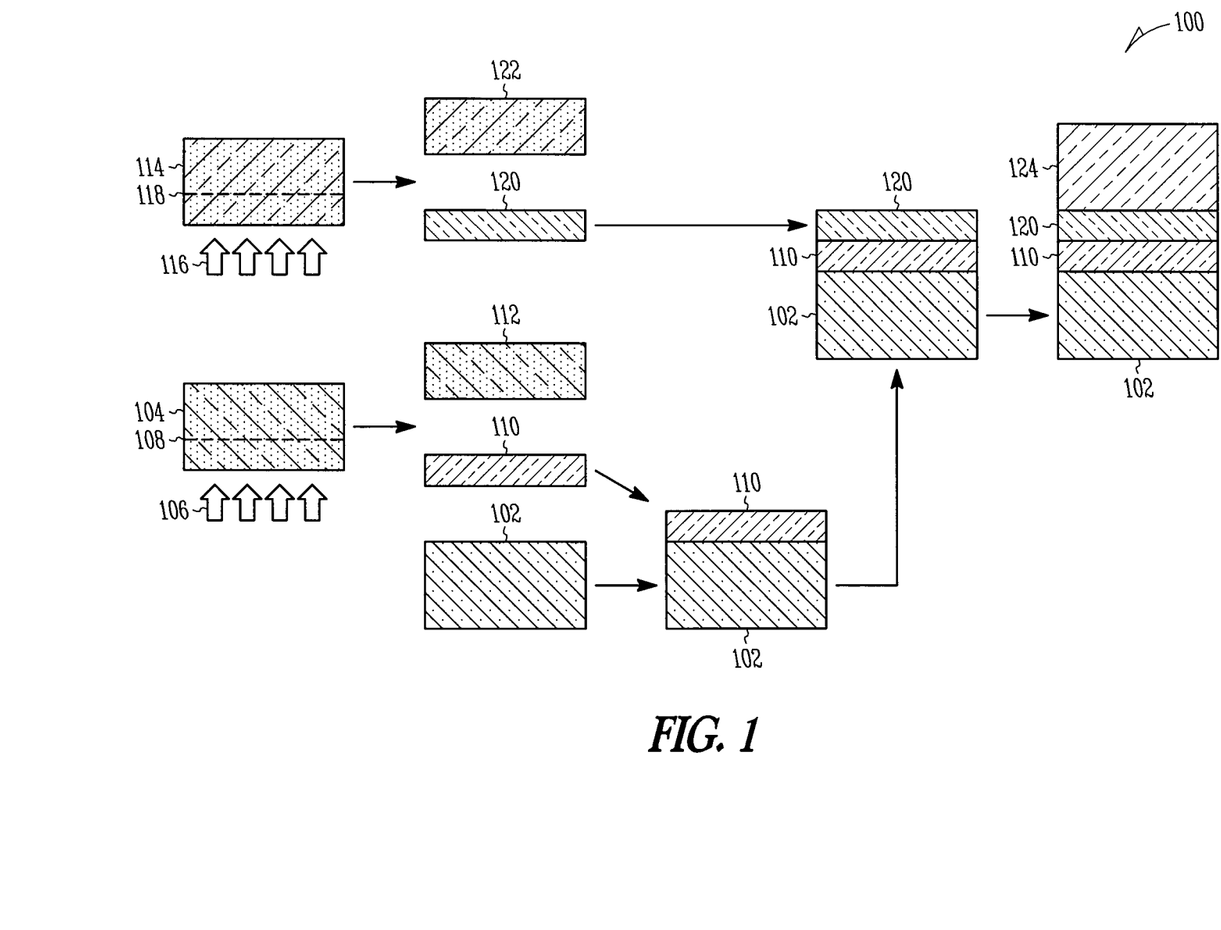
FIG. 1 illustrates a composite substrate formed according to various embodiments of the invention.

FIG. 1 shows a composite substrate 100 and a method for forming the substrate. A support substrate 102 may be formed of aluminum nitride (AlN), aluminum gallium nitride (AlGaN), sapphire, silicon (Si), gallium nitride (GaN), neodymium gallate, lithium gallate, and silicon carbide (SiC). The support material may be crystalline, polycrystalline, amorphous, or a ceramic. Ceramic AlN or polycrystalline AlN (p-AlN) may be formed by tape casting, hot pressing, sintering, or other methods known in the art.

Considerations for selecting the material and method for forming a support substrate 102 for use in light emitting devices and systems may concern the roughness and the coefficient of thermal expansion (CTE) of the support substrate. Surface roughness has a significant effect on the optical, physical and electrical properties of the active device layer and the light confinement layer, and the resulting operating characteristics of the device. The surface of the support substrate 102 may be polished after formation to provide an atomically flat front surface to reduce these problems. The use of p-AlN as support substrate 102 may have a CTE of about $4.4 \times 10^{-6}/°$ K, which may match certain III-nitride materials such as GaN, and thus provide reduced thermal stress and strain on the composite substrate 100. The difference in CTE between the support substrate and the material forming the active device layer may be selected to either be small and substantially similar to prevent stress, or selected such that the active devices are under a slight compressive strain at a normal operating temperature range. The support substrate 102 may have a thermal conductivity value of about 100 watts per meter degree Kelvin (100 W/mK) or greater.

The support substrate 102 may have an intermediate layer 110 formed on the flat front surface. The intermediate layer 110 may be formed of a high thermal conductivity oxide material having a value of about 100 watts per meter degree Kelvin (100 W/mK) or greater to provide sufficient heat removal during operation, an optical refractive index value that is less than the refractive index value of the material used for the device structure to improve light confinement, and a CTE value in the range of the material used in the support substrate 102 and a device structure 124 to reduce thermal induced stress and strain. An illustrative refractive index for intermediate layer 110 may be approximately 2.1 at a wavelength of approximately 400 nm. The intermediate layer 110 material may also have at least one surface having a roughness value and purity value sufficient for bonding to the support substrate 102 and a seed layer 120. The intermediate layer 110 may also be bonded to device structure layer 124. Materials that may have the desired properties include zinc oxide (ZnO), indium tin oxide (ITO), tin oxide ($Sn_2O$), indium oxide ($In_2O_3$), and other conducting transparent oxides. The intermediate layer 110 may have a selected thickness. The intermediate layer 110 may start as a wafer of ZnO 104 (or any other optically transparent material having high thermal conductivity, and a lower index of refraction than the active region) having a greater thickness than the selected thickness, and may be directly bonded to support substrate 102 without the use of bonding agents. Bonding agents, such as silicon oxides or silicon nitrides, may have low thermal conductivity as compared to ZnO, which may result in greater heat buildup in the device during operation as compared to direct intermediate layer bonding.

Obtaining an intermediate layer having the selected thickness may include an ion implantation 106 of ions having an energy selected to form a weakened region 108 inside the zinc oxide 104. Ions may include hydrogen or helium having an energy selected to cause damage at the selected depth forming a weakened region 108 inside the zinc oxide material 104. The intermediate layer may be formed by fracturing the zinc oxide wafer 104 at the weakened region 108 to form an intermediate layer 110 having the selected thickness, and a remaining portion of an intermediate material wafer 112, which may be subsequently used to form additional layers such as 110. Fracturing zinc oxide wafer 104 to form intermediate layer 110 and remainder wafer 112 may occur either before or after bonding to the support substrate 102. Fracturing may occur by application of mechanical stress, thermal stress, electrostatic stress, laser irradiation, or combinations. Other methods of forming an intermediate layer 110 on the support substrate 102 include the shown direct bonding method, indirect bonding with adhesion layers, chemical vapor deposition, spin coating liquid materials, molecular beam epitaxy, pulsed laser deposition and physical vapor deposition methods such as sputtering and evaporation.

The intermediate layer 110 having the selected thickness on the support substrate 102 may have a seed material layer with a selected thickness formed on a surface opposite the support substrate 102. Seed material wafer 114, which may be formed of III-nitrides such as gallium nitride (GaN), indium gallium nitride (InGaN), or aluminum gallium nitride (AlGaN), and may be polar, non-polar or semi-polar. In a polar material the surface may be either Ga-polar or N-polar, with the opposite surface the opposite polarity. The seed material may have a sufficient surface quality of less than $5 \times 10^8$ dislocations per $cm^2$ of surface area.

Obtaining the seed layer may include a free standing GaN wafer 114, an ion implantation 116 of ions having an energy selected to cause a damaged weakened region 118 inside the wafer 114 at the selected thickness. The seed GaN wafer 114 may be bonded to the intermediate layer 110, and then fractured to produce the seed layer 120 and a remaining wafer 122, or fractured first and then bonded to the intermediate layer 110 if the selected thickness is sufficient to allow handling. The remaining wafer 122 may be implanted to form additional layers similar to seed layer 120 for other devices. The GaN seed layer may have a thermal conductivity value of approximately 100 watts per meter degree K (100 W/mK) or greater.

The composite substrate comprising support substrate 102, intermediate layer 110 and seed layer 120 may now have the device layer 124 formed to complete the optoelectronic device. A device layer 124 may be formed of multi quantum well structures using III-nitride materials. The surface of the seed layer 120 may be selected to be either Ga-polar or N-polar by selected the desired polar face of the seed wafer 114 for the ion implantation. If the Ga-polar surface is desired for growth of the device layer 124, then the N-polar surface may be ion implanted and the fracture surface will be the Ga-polar surface. Alternatively, the fractured layer may be inverted prior to bonding to the intermediate layer 110 to obtain the desired surface. The Ga-polar face may be preferred for bonding to the device layer 124 for improved device quality.

Figure 2:
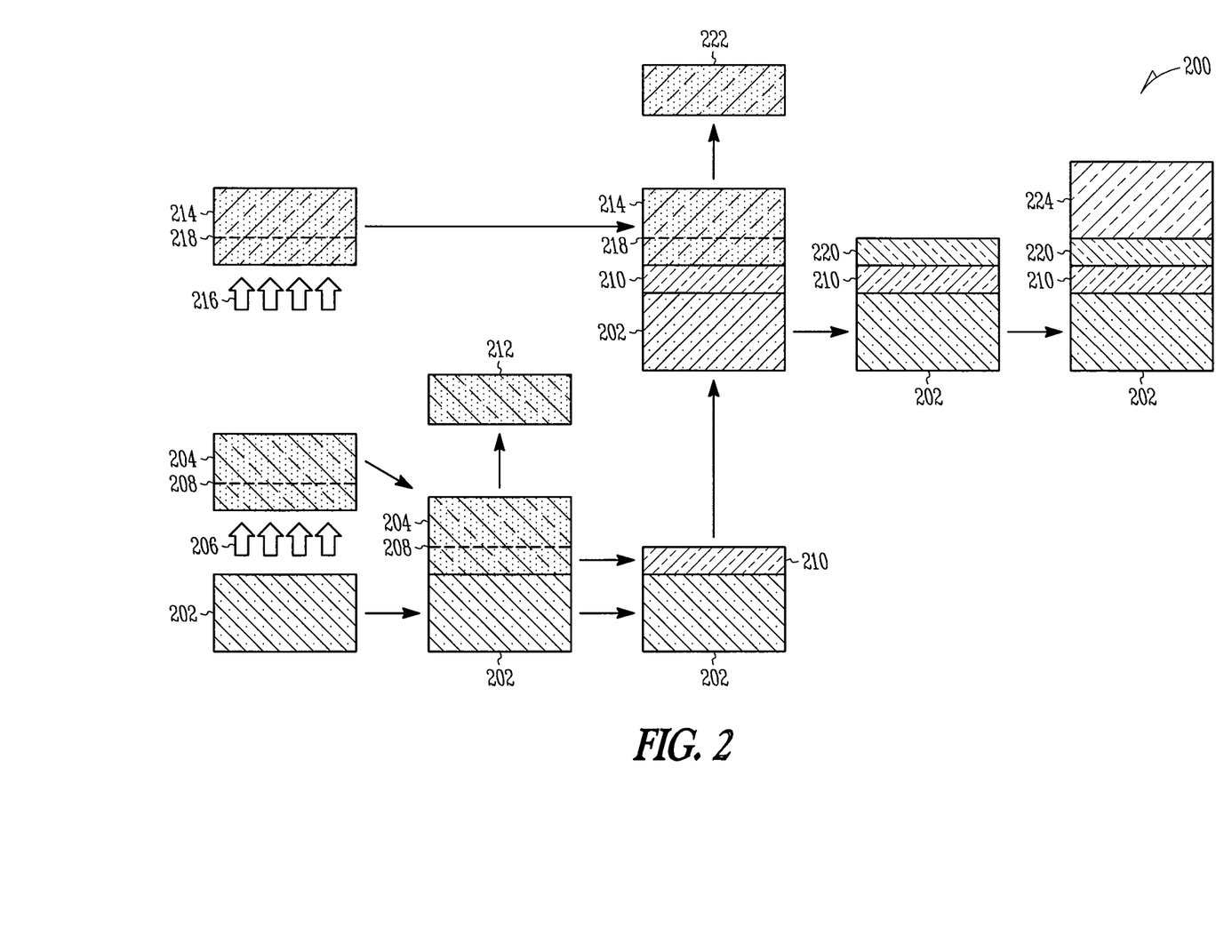
FIG. 2 illustrates a composite substrate formed according to various embodiments of the invention.

FIG. 2 shows a composite substrate 200 and an alternative method for forming the composite substrate. This method shows the attachment of an intermediate material wafer to the substrate and then thinning the intermediate material to the selected thickness by either fracturing the intermediate material to form a remaining wafer or by polishing the intermediate material to remove the excess material.

A support substrate 202 may be directly bonded to an intermediate material 204 such as ZnO. In a first embodiment, the intermediate material 204 may be ion implanted 206 to form a weakened region at a selected distance 208 within the intermediate material 204 prior to the bonding, and then the intermediate wafer 204 may be fractured to form the intermediate layer 210 and a remaining wafer 212. In an alternative embodiment, the non-implanted wafer 204 may be bonded to the support substrate 202 and then thinned by a combination of one or more etching, polishing and grinding processes until the remaining thickness is the selected distance 208 to form the intermediate layer 210 on the support substrate 202.

A seed layer may be attached to the intermediate layer 210 by ion implanting 216 the seed wafer 214 to form a weakened region at a selected distance 218, then bonding to the intermediate layer 210 and fracturing the seed wafer to form the seed layer 220 and a remaining seed wafer 222. Alternatively, the non-implanted seed wafer 214 may be directly bonded to the intermediate layer 210 and polished, etched or ground to remove the excess seed material to form the seed layer 220 having a selected thickness. In certain embodiments the opposite polarity surface of the seed wafer from that desired for the surface of the active device 214 is bound to the intermediate layer 210, e.g., the N-polar surface of a seed wafer is bound to a ZnO intermediate layer to leave an exposed Ga-polar seed surface, which in turn results in a Ga-polar active device.

Alternatively, the intermediate layer 210 may be directly bonded to the seed layer 220, and then the combination intermediate/seed layer may then be directly bonded to the support substrate 202. The composite substrate may now be ready for formation of the active device layer 224. In an alternative method, the intermediate layer 210 may be bonded to the device layer 224 without the seed layer. Alternatively, the bonding may include the use of a thin dielectric layer, such as oxide or nitride, to improve the bonding strength.

Figure 3:
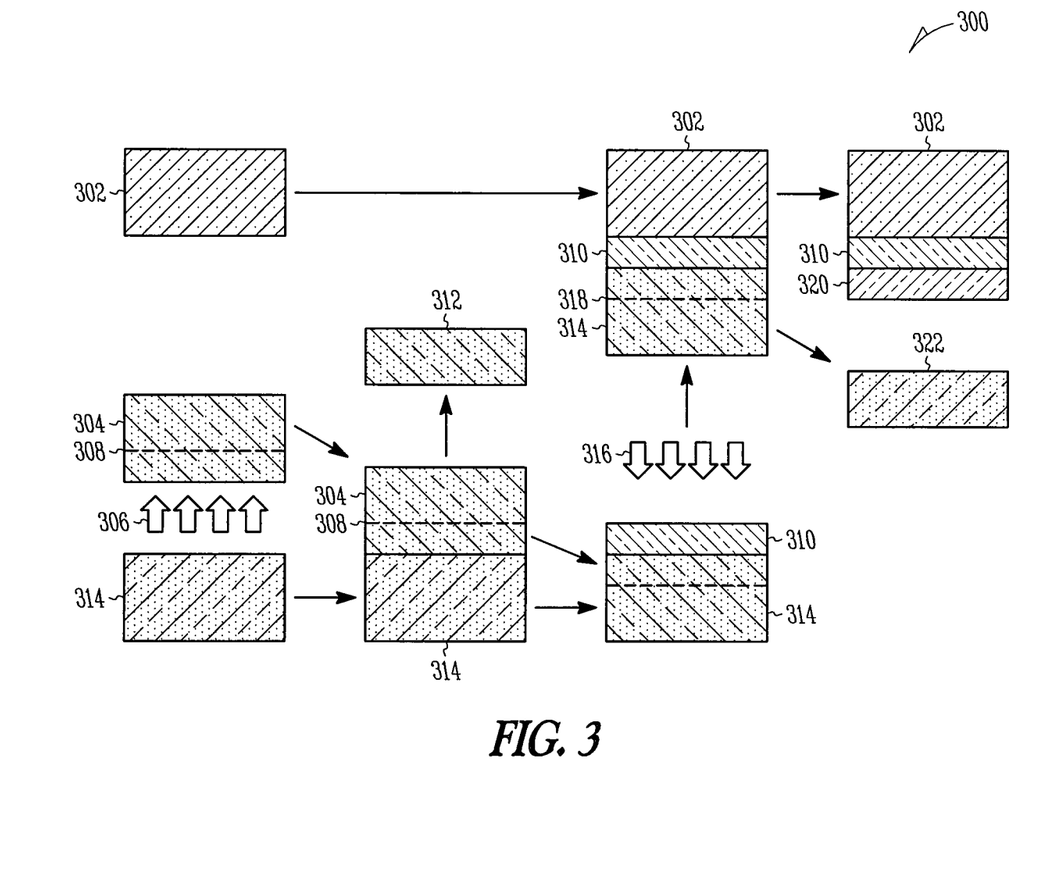
FIG. 3 illustrates a composite substrate formed according to various embodiments of the invention.

FIG. 3 shows a composite substrate 300 and an alternative method for forming the composite substrate. An intermediate material wafer 304, for example ZnO, may be ion implanted 306 to form a weakened region at a selected depth 308. The intermediate wafer 304 may be directly bonded to a free standing III-nitride seed material wafer 314. Alternatively, a bonding material, such as a thin dielectric layer, may be used to improve bond adhesion. The intermediate material wafer 304 may be fractured along the weakened region to form intermediate layer 310 having a selected thickness and a remaining portion 312.

The seed material wafer 314 may be ion implanted 316 through the selected thickness of the intermediate layer 310 to form a weakened region at a selected depth 318 within the seed material wafer 314. The energy of the implanted ions may be selected to create damage at the selected location by increasing the energy to compensate for the increased amount of material to be penetrated, as represented by the intermediate layer 310. The combined intermediate layer and seed material structure may be directly bonded to a support substrate 302, and the seed material wafer 314 may be fractured along the weakened region to form a seed layer 320 having the selected thickness and a remaining seed material wafer 322, thus forming the composite substrate 300. An active device layer may be formed on the seed layer 320 of the composite substrate 300 formed by the seed layer 320, the intermediate layer 310, and the support substrate 302.

Figure 4:
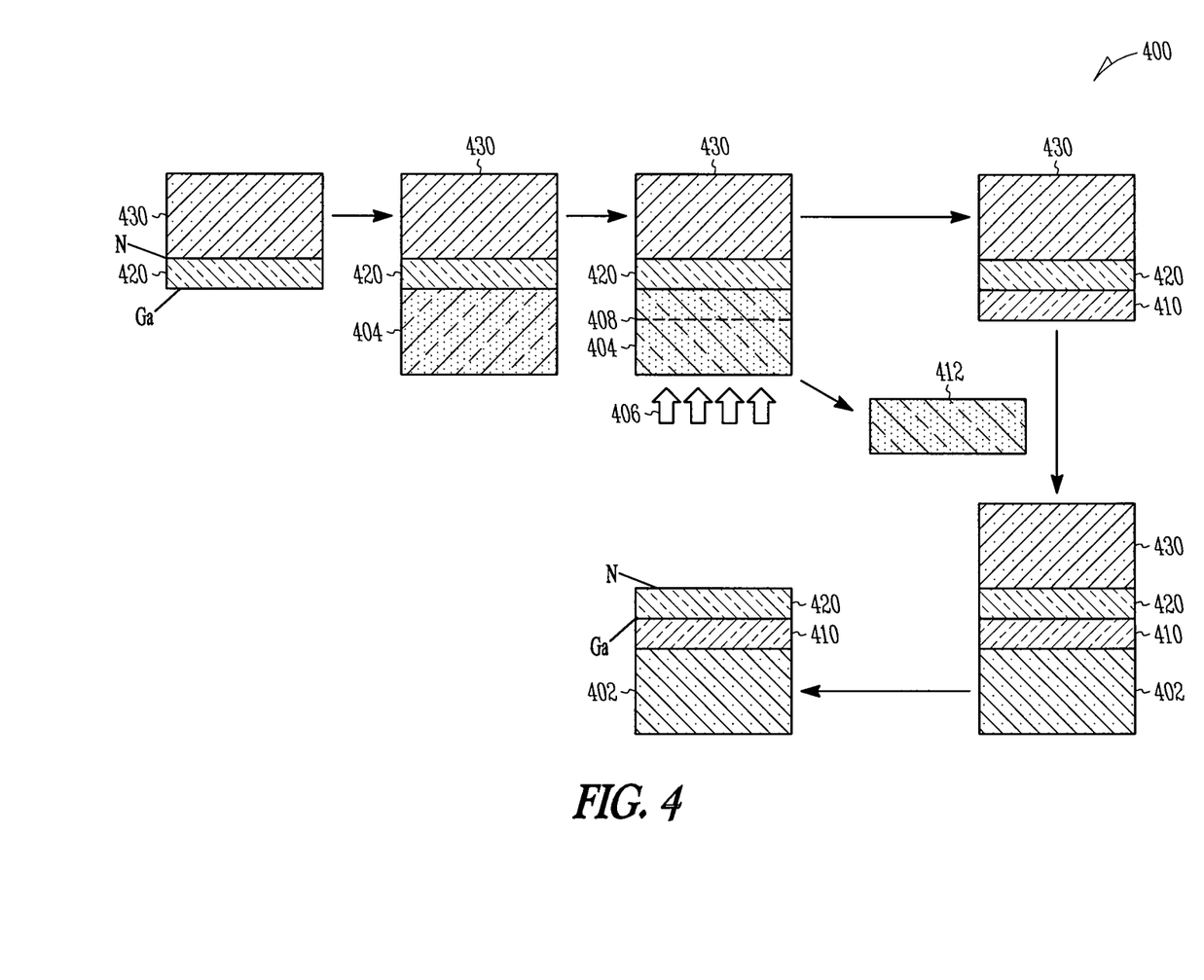
FIG. 4 illustrates a composite substrate formed according to various embodiments of the invention.

FIG. 4 shows a composite substrate 400 formed by a template method. A seed layer 420, typically formed of a III-nitride material such as GaN, may be grown to a desired thickness with a Ga-polarity exposed surface (i.e., N-polarity down on a growth substrate 430), and then bonded to an intermediate carrier substrate 404, such as ZnO as in the prior illustrative examples. The intermediate material 404 may be thinned to a desired thickness as discussed previously, including polishing, grinding or an ion implantation 406 to form a weakened region at a desired depth 408. The intermediate material 404 may also be deposited as previously discussed, for example by CVD or sputtering, at the desired thickness. In the case of forming a weakened region in intermediate material 404, the wafer may be fractured either before or after (as shown) attachment to the seed layer 420, to form the final intermediate layer 410, and a remaining ZnO wafer 412.

The seed layer 420 is obstructed by the growth substrate 430 in the illustrative template method, and the intermediate layer 410 may be bonded to a support substrate 402, which may be formed of AlN as in the prior examples. The growth substrate 430 may be removed, for example by grinding, polishing, back lapping or other methods known in the art, which provides a composite substrate formed of support substrate 402, intermediate layer 410 and seed layer 420, ready for formation of an active device layer, and similar to the composite substrates of the prior examples. In the present illustrative example, the exposed face of the seed layer 420 is the N-polarity face, which may not be the desired polarity for all applications. As would be easily understood by one of ordinary skill in the art, the Ga-polarity face may be exposed by inserting another transfer operation to another intermediate substrate prior to the attachment to the support substrate 402.

The four described methods for forming a composite optoelectronic device substrate, and the described variations in each method, may result in an arrangement having an aluminum nitride support substrate, a zinc oxide intermediate layer, and a gallium nitride seed layer. This composite substrate may then have an active device layer, such as a multi quantum well device, attached or grown on the substrate. The intermediate layer, which may be formed of zinc oxide or other transparent insulators having high thermal conductivity, may have a refractive index that is less than the index of refraction of the active device layers for improved light confinement, for example a refractive index of approximately 2.1 at a wavelength of approximately 400 nm, and have a thickness of from 0.1-1000 nm.

The zinc oxide intermediate layer, which may have a formula of ZnO, may have a surface roughness of from about 5-15 Å while the support substrate may have a surface that is atomically flat to improve direct bonding with no intermediate bonding aids. Direct bonding improves the thermal conductivity of the composite substrate.

The aluminum nitride support substrate may have a coefficient of thermal expansion of approximately $4.4 \times 10^{-6}/°K$ to match the active layer thermal expansion and reduce thermal mismatch strain, and the gallium nitride seed layer may have a dislocation density of less than $5.0 \times 10^8/cm^2$, a thickness of from 0.1-1000 nm, and a Ga-polarity surface to improve device quality. An electronic system may use optoelectronic devices using the composite substrate.

The illustrative methods include forming the intermediate layer by bonding a wafer of an intermediate material such as ZnO to a support substrate such as AlN after polishing the support substrate to a root mean square flatness of less than 0.01 micron to improve direct bonding strength. The seed layer may be formed from a thick free standing wafer of a III-nitride material such as GaN, and thinning the wafer to the selected thickness by polishing or by ion implanting the surface to form a damaged region at the selected thickness within the wafer and bonding the ion implanted surface to the intermediate layer. Then the wafer may be fractured at the damaged region by mechanical, thermal, or electrostatic stress. The free standing wafer of III-nitride may be bonded to the intermediate layer directly, or by use of a bonding adhesion material such as a dielectric such as silicon nitride, which may be less than 10 nm thick.

The support substrate may be formed from aluminum nitride (AlN), aluminum gallium nitride (AlGaN), sapphire, silicon (Si), gallium nitride (GaN), neodymium gallate, lithium gallate, and silicon carbide (SiC), in either a crystalline, polycrystalline and an amorphous state, or as a ceramic formed by punching, casting or firing. The intermediate layer may be formed of zinc oxide (ZnO), indium tin oxide (ITO), tin oxide ($Sn_2O$), indium oxide ($In_2O_3$), or other conductive transparent oxides. The seed layer may be formed of gallium nitride (GaN), indium gallium nitride (InGaN), or aluminum gallium nitride (AlGaN) or other III-nitride materials, which may have a surface that is polar, non-polar or semi-polar. Some applications may prefer a seed layer having either Ga-polar or N-polar surfaces with less than $5\times10^8$ dislocations per $cm^2$. The support, intermediate, seed and active optical layers preferably have as high a thermal conductivity as possible to reduce material heating, and as close a coefficient of thermal expansion to the other layers as possible to reduce material strain.

Figure 5:
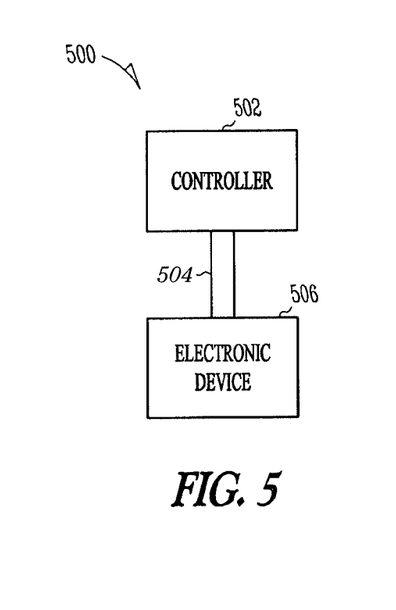
FIG. 5 illustrates a simplified block diagram of a controller coupled to an electronic device, according to various embodiments of the invention.

FIG. 5 illustrates a simplified diagram for an illustrative electronic system 500 having one or more devices including an optical signal transmission device according to various disclosed embodiments. The electronic system 500 may include a controller 502, a bus 504, and an electronic device 506, where bus 504 provides electrical or optical signal transmission between controller 502 and electronic device 506. In various embodiments, the controller 502 and/or electronic device 506 may include an optical data transmission device. Electronic system 500 may include information handling, wireless, telecommunication, fiber optic, automotive, electro-optic, mobile electronics, handheld devices, and computer systems. Electronic device 506 may comprise a microprocessor, a floating point unit, an arithmetic logic unit, a memory device, a multiplexer, an address decoder, a power controller, or any other electronic device used in computer, telecommunication, sensor, display and other products.

Figure 6:
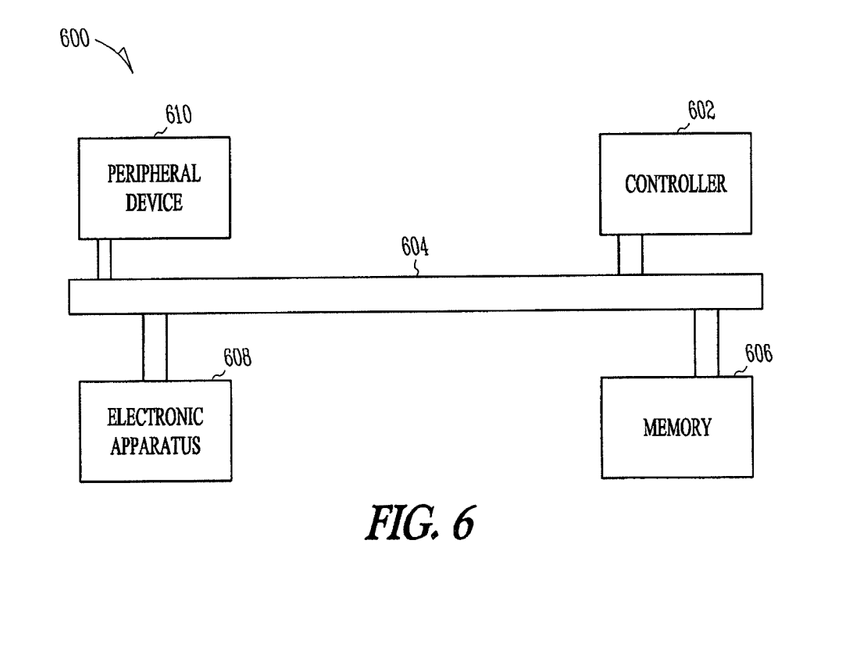
FIG. 6 illustrates an electronic system having devices formed in accordance with various embodiments of the invention.

FIG. 6 depicts a diagram of an electronic system 600 having at least one device formed in accordance to the disclosed embodiments, including a controller 602 and a memory 606. Controller 602 and/or memory 606 may include a non-volatile memory device. The system 600 may also include an electronic apparatus 608 and a bus 604, where the bus 604 may provide data transmission between controller 602 and electronic apparatus 608, and between controller 602 and memory 606. The bus 604 may include an address, a data bus, and a control bus, each independently configured. The bus 604 may use common conductive lines for providing address, data, and/or control, or optical transmission lines, the use of which may be regulated by the controller 602. In some embodiments, the electronic apparatus 608 may include additional memory devices configured similar to the memory 606. Some embodiments may include an additional peripheral device 610 coupled to the bus 604. In an embodiment, the controller 602 comprises a processor. Any of the controller 602, the memory 606, the bus 604, the electronic apparatus 608, and the peripheral device 610 may include an optical transmission device formed in accordance with the disclosed embodiments.

System 600 may include, but is not limited to, an information handling device, telecommunication system, mobile electronic device such as a laptop computer, handheld personal electronic device such as a personal digital assistant (PDA) and palm top, handheld communication device such as a cell phone, digital camera, DVD recorder, and computer. Peripheral device 610 may include a display, additional storage memory, or other control device that may operate in conjunction with controller 602 and/or memory 606.

With such an arrangement, a composite substrate with high thermal conductivity, low thermal mismatch between layers and low imposed material stress, and having an intermediate layer with an index of refraction lower than an average index of refraction of the active optoelectronic layers for improved optical confinement, may be obtained having improved reliability, cost and operational parameters.

The detailed description refers to the accompanying drawings that show, by way of illustration, specific aspects and embodiments in which the present disclosed embodiments may be practiced. These embodiments are described in sufficient detail to enable those skilled in the art to practice aspects of the present invention. Other embodiments may be utilized, and structural, logical, and electrical changes may be made without departing from the scope of the disclosed embodiments. The various embodiments are not necessarily mutually exclusive, as some embodiments can be combined with one or more other embodiments to form new embodiments.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present disclosed embodiments includes any other applications in which embodiments of the above structures and fabrication methods are used. The detailed description is, therefore, not to be taken in a limiting sense and the scope of the present invention is defined only by the appended claims, along with the full scope of equivalents to which such claims are entitled.

What is claimed is:

1. A composite optical device substrate, comprising:
    an aluminum nitride support substrate;
    a zinc oxide intermediate layer disposed on a portion of the support substrate having a first thickness;
    a gallium nitride seed layer disposed on the zinc oxide intermediate layer having a second thickness; and
    an active device layer formed on the gallium nitride seed layer, the active device layer comprising at least one of indium gallium nitride, aluminum gallium nitride, and gallium nitride, the zinc oxide intermediate layer having a refractive index that is less than a refractive index of the active device layer.

2. The composite optical device substrate of claim 1, wherein the zinc oxide intermediate layer has an approximate formula of ZnO.

3. The composite optical device substrate of claim 1, wherein the first thickness is less than 1000 nm.

4. The composite optical device substrate of claim 1, wherein the second thickness is less than 1000 nm.

5. The composite optical device substrate of claim 1, wherein the zinc oxide intermediate layer has at least one surface with a surface roughness less than 15 Angstroms.

6. The composite optical device substrate of claim 1, wherein the aluminum nitride support substrate has a coefficient of thermal expansion of approximately $4.4 \times 10^{-6}/^\circ K$.

7. The composite optical device substrate of claim 1, wherein the gallium nitride seed layer has a dislocation density of less than $5.0 \times 10^{8}/cm^{2}$.

8. The composite optical device substrate of claim 1, wherein the gallium nitride seed layer has a surface having an N type polarity contacting the intermediate layer.

9. The composite optical device substrate of claim 1, wherein the gallium nitride seed layer is in direct physical contact with the zinc oxide intermediate layer.

10. The composite optical device substrate of claim 1, further comprising a silicon nitride layer disposed between the gallium nitride seed layer and the zinc oxide intermediate layer.

11. The composite optical device substrate of claim 1, wherein the aluminum nitride support substrate is in direct physical contact with the zinc oxide intermediate layer.

12. An optical system, comprising:
   an optoelectronic device including an aluminum nitride support substrate, a zinc oxide intermediate layer, a gallium nitride layer, and an active device layer, the zinc oxide intermediate layer having a refractive index that is less than a refractive index of the active device layer.

13. The optical system of claim 12, wherein the aluminum nitride support substrate is in direct contact with the zinc oxide intermediate layer, and the zinc oxide intermediate layer is in direct contact with the gallium nitride layer.

* * * * *